(12) United States Patent
Griswold et al.

(10) Patent No.: US 9,971,009 B2
(45) Date of Patent: May 15, 2018

(54) MAGNETIC RESONANCE IMAGING (MRI) WITH AUTO-DETECTION AND ADAPTIVE ENCODINGS FOR OFFSET FREQUENCY SCANNING

(71) Applicant: Case Western Reserve University, Cleveland, OH (US)

(72) Inventors: Mark Griswold, Shaker Heights, OH (US); Kechung Liu, Solon, OH (US); Dan Ma, Cleveland, OH (US); Tiejun Zhao, Pittsburgh, PA (US)

(73) Assignee: CASE WESTERN RESERVE UNIVERSITY, Cleveland, OH (US)

( * ) Notice: Subject to any disclaimer, the term of this patent is extended or adjusted under 35 U.S.C. 154(b) by 1060 days.

(21) Appl. No.: 14/257,115

(22) Filed: Apr. 21, 2014

(65) Prior Publication Data

US 2015/0301146 A1 Oct. 22, 2015

(51) Int. Cl.
*G01R 33/565* (2006.01)

(52) U.S. Cl.
CPC .. *G01R 33/56536* (2013.01); *G01R 33/56563* (2013.01)

(58) Field of Classification Search
CPC .............. G01R 33/56536; G01R 33/56563
See application file for complete search history.

(56) References Cited

U.S. PATENT DOCUMENTS

| | | | | |
|---|---|---|---|---|
| 8,093,900 B2* | 1/2012 | Bennett | ............... | G01R 33/3692 324/307 |
| 9,335,195 B2* | 5/2016 | Ong | ........................... | G01F 1/74 |
| 9,389,294 B2* | 7/2016 | Sveinsson | ........ | G01R 33/56563 |
| 9,784,807 B2* | 10/2017 | Nittka | ................. | G01R 33/3678 |
| 9,841,483 B2* | 12/2017 | Wheaton | .......... | G01R 33/56536 |
| 2015/0177354 A1* | 6/2015 | Bachschmidt | ... | G01R 33/56536 324/309 |
| 2015/0285890 A1* | 10/2015 | Bachschmidt | ......... | G01R 33/34 324/309 |
| 2016/0154080 A1* | 6/2016 | Wiens | .............. | G01R 33/56536 324/309 |
| 2016/0231401 A1* | 8/2016 | Wang | ................. | G01R 33/3873 |

OTHER PUBLICATIONS

Sutter et al.; "Reduction of Metal Artifacts in Patients with Total Hip Arthroplasty with Slice-encoding Metal Artifact Correction and View-Angle Tilting MR Imaging 1"; Oct. 2012; Radiology:vol. 265, No. 1; pp. 204-214.*
Lu et al.; "SEMAC:Slice Encoding for Metal Artifact Correction in MRI"; 2009; Magnetic Resonance in Medicine 62:66-76.*

* cited by examiner

*Primary Examiner* — Dixomara Vargas
(74) *Attorney, Agent, or Firm* — Quarles & Brady LLP

(57) ABSTRACT

Example apparatus and methods provide improved resolution over conventional magnetic resonance imaging (MRI) that is affected by the presence of metal (e.g., prosthetic hip) in the MRI field of view (FOV). Embodiments may excite a slice that is affected by a susceptibility effect produced by metal. Embodiments may excite the slice using a first pre-determined frequency and a plurality of scout frequency encodings. Embodiments may acquire nuclear magnetic resonance (NMR) signal data from the slice in response to the first pre-determined frequency and the plurality of scout frequency encodings and select frequency encodings to use to image the slice as a function of an amplitude of the NMR signal data. Frequency encodings are selected to produce data that will help account for distortions caused by the susceptibility effect.

14 Claims, 11 Drawing Sheets

MAGNETIC RESONANCE IMAGING (MRI) WITH AUTO-DETECTION AND ADAPTIVE ENCODINGS FOR OFFSET FREQUENCY SCANNING

BACKGROUND

When metal is present in an object to be imaged using magnetic resonance imaging (MRI), the metal may introduce a susceptibility effect that in turn produces a B0 field inhomogeneity, which may be referred to as ΔB0. ΔB0 disturbs the frequency encoding relationship in MRI. Disturbing the frequency encoding relationship may produce in-plane and through-plane artifacts that compromise reconstructed images. The artifacts may include distortions, pile-up, signal voids, and other distortions. MRI of regions of bodies where there are metal implants (e.g., hip joints, knee joints, dental implants, screws, plates) has been challenged due to the susceptibility effect. The susceptibility effect may cause significant local changes in the main magnetic field B0 and may also cause significant local changes in the radio frequency (RF) field B1. Changes in the B0 and B1 fields produce significant impacts on RF pulse performance.

Different conventional approaches have been applied to address the susceptibility effect caused by metal in magnetic resonance (MR) images. These conventional approaches may have used high bandwidth (BW) for slice selection and frequency encoding. Some conventional approaches include a view angle tilted (VAT) approach, a slice encoding for metal artifact correction (SEMAC) approach, and a multi-acquisition variable-resonance image combination (MAVRIC) approach.

SEMAC and MAVRIC attempt to reduce through-plane artifacts by sampling at different offset frequency windows. Different metals may have different properties and characteristics. For example, stainless steel generates a larger offset frequency spectrum than titanium. The offset frequencies spectrum may be determined by characteristics of the metals that are used. With SEMAC and MAVRIC, the number of encoding steps required to improve an imaging result varies directly with the size of the offset frequency spectrum. As the offset frequency spectrum increases, additional encoding steps may be required. Additional encoding steps may result in longer imaging times, which may be difficult for patients to tolerate, and which may reduce the number of patient imaging sessions that may be performed per day. Unfortunately, when a patient presents for imaging, the composition of their implant may not be known. Thus, the number of encoding steps that may be needed for these conventional approaches may be unknown, leading to an educated guess or other heuristic approach. When heuristics are employed, imaging time may be unnecessarily long when too many encodings are used or image quality may be compromised when not enough encodings are used.

FIG. 1 illustrates how metal in MRI introduces two kinds of artifacts or distortions. A piece of metal 120 is illustrated producing distortions both in-plane and through-plane (slice). An in-plane distortion 100 is caused by a distorted readout gradient that causes a pixel dislocation in the readout direction. A through-plane (e.g., slice profile) distortion 110 is caused by a distorted slice selection gradient. The presence of metal 120 in the field of view (FOV) causes local B0 field changes due to the susceptibility effect. The local B0 field changes are proportional to the B0 field strength and may be different for different types of metals. The presence of metal 120 in the FOV also causes local B1 field changes because metal 120 possesses different electromagnetic properties than other materials (e.g., human tissue, animal tissue).

FIG. 2 illustrates how the susceptibility effect differs for different materials. The susceptibility induced by metals depends on the metal type, the metal shape, and B0. A plastic bar illustrated in MRI 210 provides a reference image that helps visualize the distortions caused by the susceptibility effect of metals. A titanium bar is illustrated in MRI 200 and a steel bar is illustrated in MRI 220. The distortions around the metal bars cause information around the metal part to be lost for clinical diagnosis. The distortions may cause signal voids, falsified hyper signal intensity, and other undesirable effects. Images having metal in the FOV may also exhibit distortion due to offset resonance. Additionally, images having metal in the FOV may not be able to suppress some fat signal. Thus, conventional approaches may have employed additional encodings, which caused longer imaging times. Since the number of extra encodings required may vary based on the material of the implant (e.g., stainless steel, titanium, chrome-moly alloy), and since the material of the implant may not be known, the number of additional encodings may be too high or too low.

FIG. 3 provides an MRI 300 of a hip having a metal implant where there has been no correction. MRI 300 shows that with no correction, diagnostic information is lost. FIG. 3 also provides an MRI 310 of a hip having a metal implant where there has been some correction using conventional techniques. While there has been some improvement in image quality, diagnostic information is still lost.

FIG. 4 illustrates how conventional approaches that use extra encodings to cover an offset frequency spectrum may take longer than necessary due to unnecessary encodings. The offset frequency encoding spectrum illustrated is too wide. A piece of metal 410 may produce distortions for a slice profile 400. Some extra encodings 420 may be useful on a first side of the slice profile 400 and other extra encodings 430 may also be useful on a second side of the slice profile 400. The extra encodings may be frequency encodings at a frequency other than the frequency used for slice 400. Rather than the slice profile being a regular shape (e.g., rectangle), distortion 412 may stretch, compress, or otherwise change the profile out of the regular shape. The extra encodings 430 may acquire signal that can be used to correct for or otherwise account for the distortion. The encodings 440 and 450 are outside the distortion area and thus may provide no extra signal from which a correction can be made. Since the distortion 412 may not be predictable before imaging, many extra encodings may be employed, some of which may be wasteful. For example, extra encodings 440 and extra encodings 450 may be unnecessary and waste time. Conventional approaches like high bandwidth excitation and readout VAT, SEMAC, and MAVRIC may use a pre-determined set of extra encodings to capture offset frequencies. The amount of extra encoding may be a heuristic or empirical practice that tries to account for metal type, size, shape, and other factors.

Figure 11:
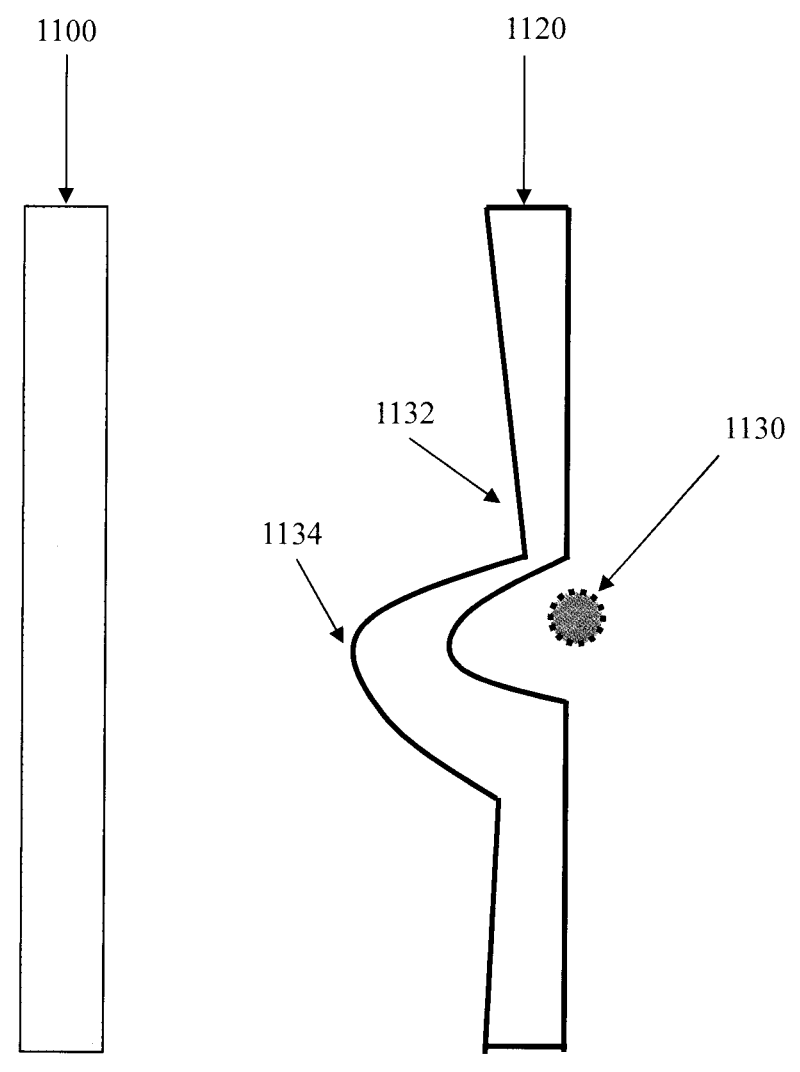

FIG. 11 illustrates a desired slice profile 1100 and a distorted slice profile 1120. A piece of metal 1130 has produced distortions of the slice profile 1120 at 1132 and 1134. At 1132, the slice profile has been compressed and at 1134 the slice profile has been widened and shifted.

BRIEF DESCRIPTION OF THE FIGURES

FIG. 11 illustrates a desired slice profile 1100 and a distorted slice profile 1120.

DETAILED DESCRIPTION

Example apparatus and methods facilitate determining a relevant offset frequency spectrum in a shorter period of time than conventional systems. Example apparatus and methods analyze MRI k-space data to determine the offset frequency spectrum relevant to a particular piece of metal in a particular field of view (FOV) under particular conditions. Analyzing the MRI k-space data to determine relevant additional frequency encodings for a slice rather than applying a heuristic or empirical approach facilitates determining an appropriate number of extra encodings to produce improved suppression of metal induced susceptibility artifacts in a shorter period of time.

Figure 1:
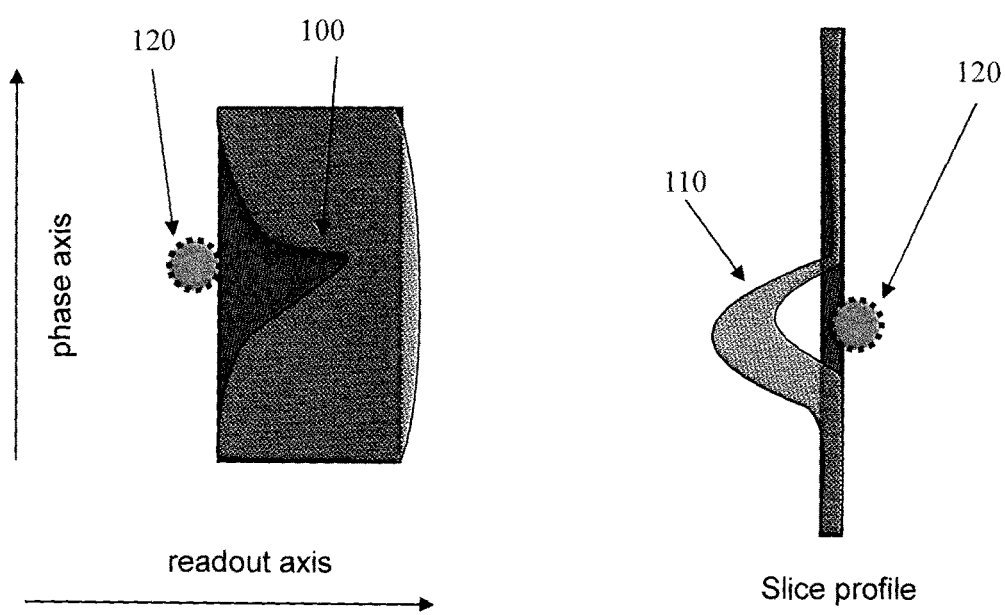
FIG. 1 illustrates how metal introduces two kinds of artifacts or distortions in MRI.
Figure 2:
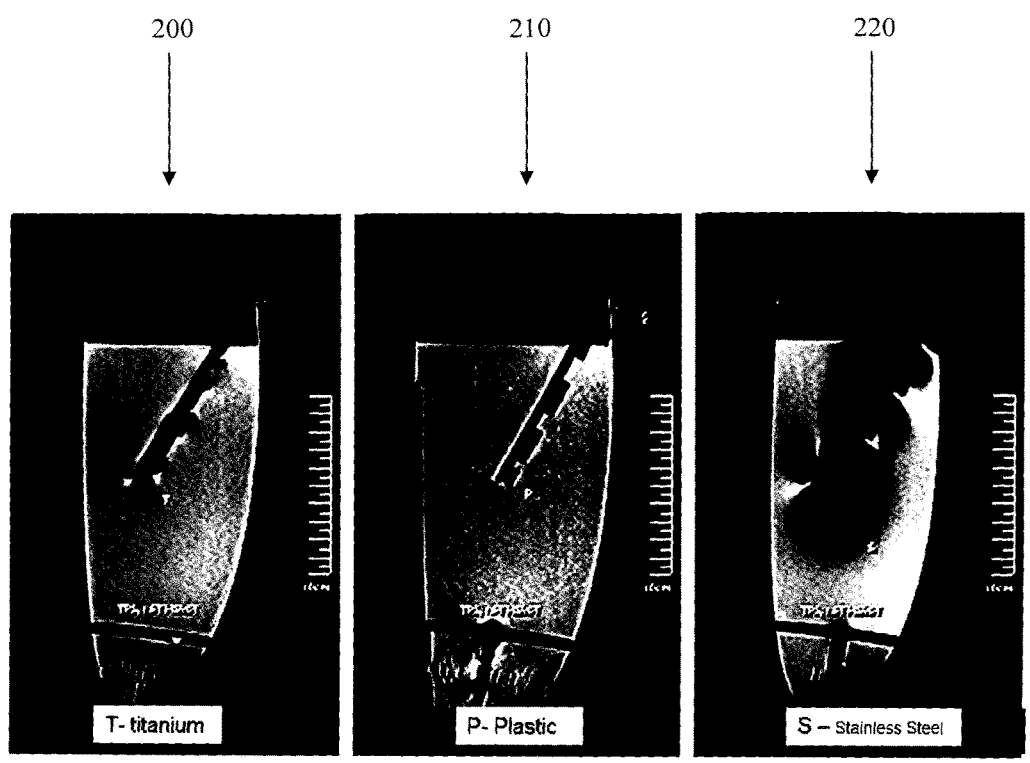
FIG. 2 illustrates how the susceptibility effect differs for different materials.
Figure 3:
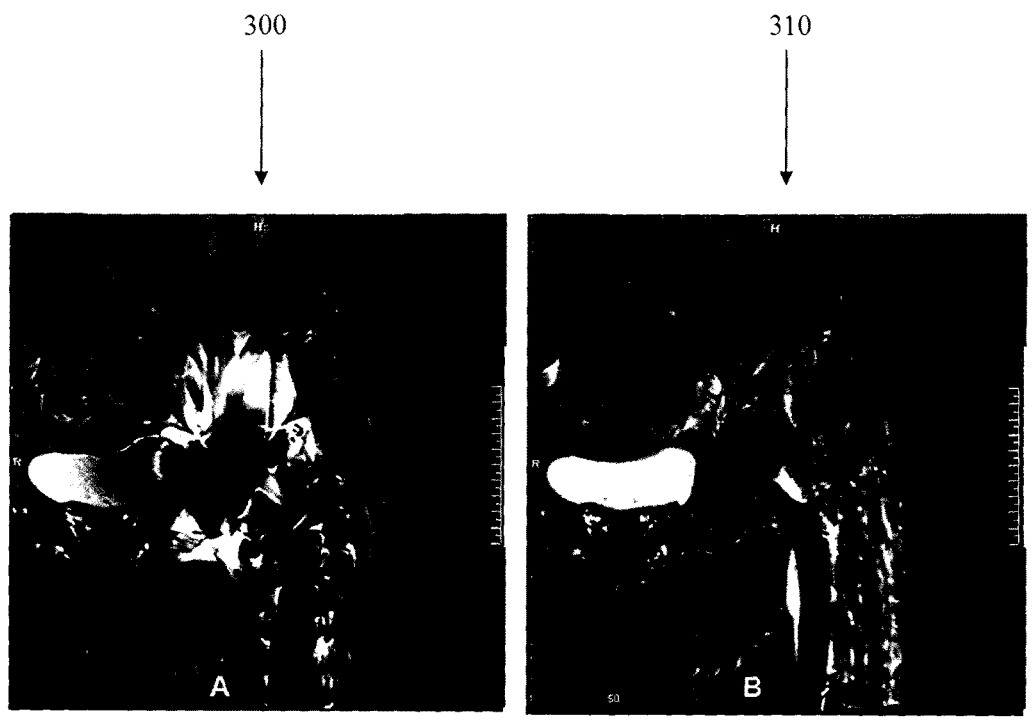
FIG. 3 illustrates an MRI of a hip having a metal implant.
Figure 4:
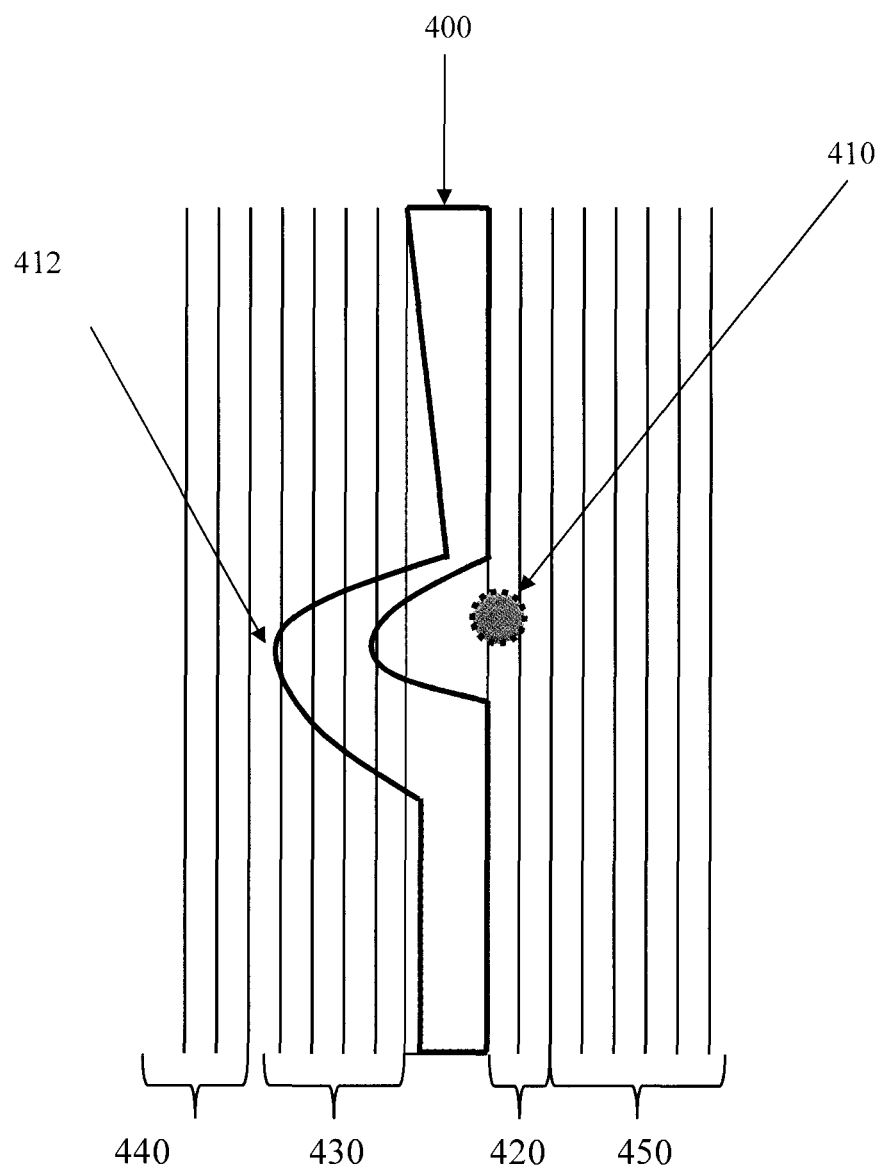
FIG. 4 illustrates extra encodings covering the offset frequency spectrum in conventional approaches.
Figure 5:
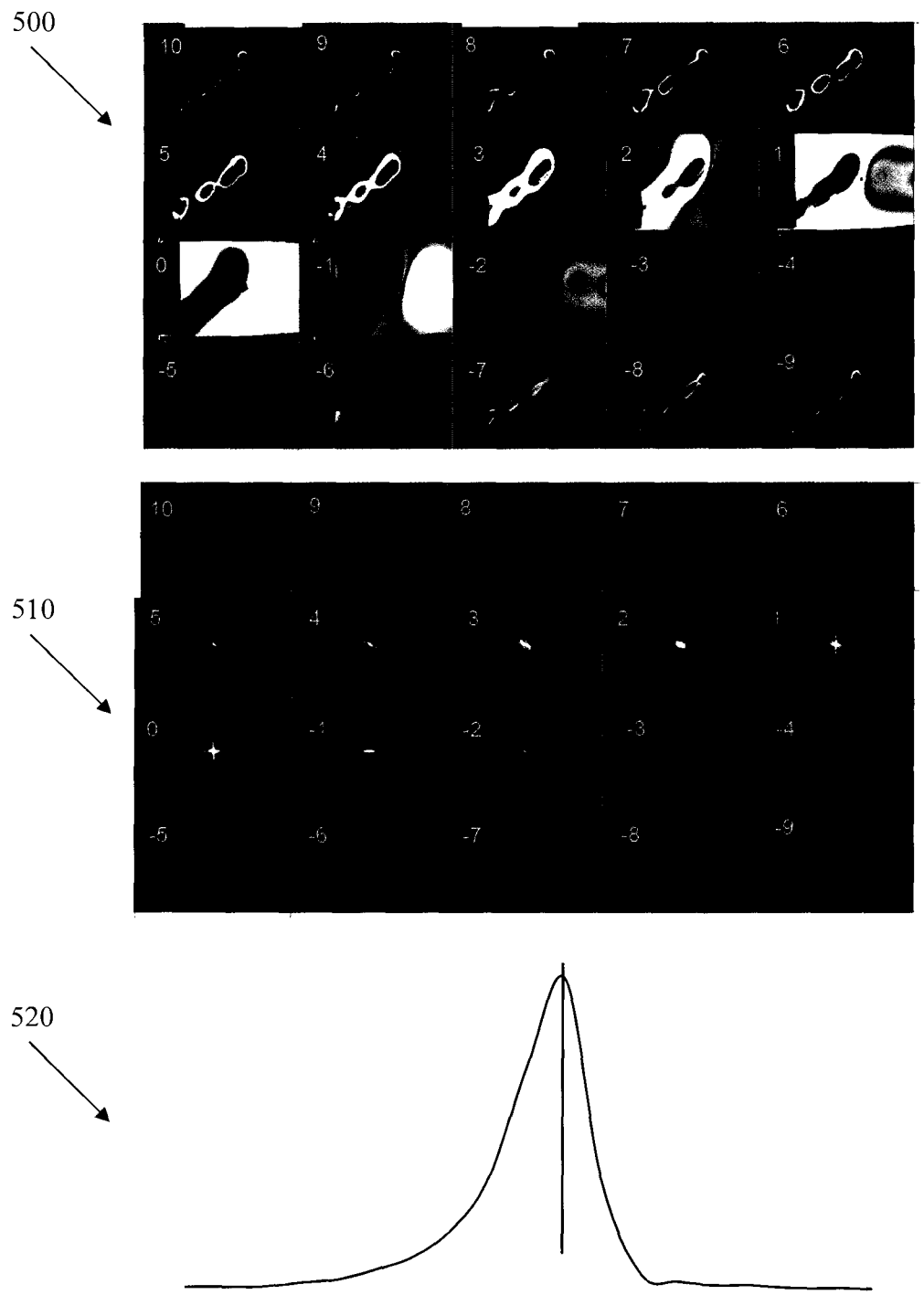
FIG. 5 illustrates original images for twenty encodings, the k-space amplitudes for the twenty original images, and a plot of the Kx=0, Ky=0 signal intensity across different offset frequencies.

FIG. 5 illustrates original images 500 for twenty different encodings of a single slice. FIG. 5 also illustrates the k-space amplitudes 510 for the twenty original images and a plot 520 of the Kx=0, Ky=0 signal intensity across the different offset frequencies imaged in 500. The twenty original images in 500 are all from one slice but were produced using encodings having different phases. Because all twenty original images in 500 have different phases they can be compressed down to a single slice. The compressed down slice can then be used to assign signal to where the signal should be instead of where the signal actually has been displaced to by the distortion caused by to the metal.

FIG. 5 illustrates the result of scout scanning for an offset frequency spectrum. The offset frequency spectrum identifies a range of frequencies in which an actual acquisition is off center from a desired slice profile. The images in 500 may be acquired without a phase encoding gradient (e.g., Ky=0) but with frequency encoding and a normal slice selection gradient and readout gradient. The images in 500 may be acquired with different offset frequencies. In one embodiment, the number of images acquired during the scout scanning, which is determined by the number of offset frequencies that are tried, may vary and may be controlled, for example, by real-time or near real-time analysis of the acquired k-space data.

The analysis of the k-space data may seek the amplitude of NMR signal at a pre-determined location (e.g., center of k-space (Kx=0, Ky=0)). Recall that the center of k-space is the integral of the imaging area. Intensity curves may be plotted for the images that are acquired with different offset frequencies. Plotting the intensity curves facilitates estimating the offset frequency spectrum where information shifted by the distortion is available, which in turns facilitates selecting relevant offset frequency encodings for future imaging. Once relevant offset frequency encodings have been determined, imaging may proceed with a more optimal set of extra encodings than is possible with conventional systems.

Example apparatus and methods may perform N extra encodings for slices that are impacted by the susceptibility effect, N being an integer (e.g., 20, 50). Example apparatus and methods may first perform the N extra encodings for a single TR (repetition time) rather than for a complete set of TRs (e.g., T=256). With a single encoding, which would provide no opportunity for correcting for distortions caused by metal in the FOV, the time consumed acquiring MR data would be a function of TR. With N encodings, which would provide an opportunity for correcting for distortions, the time consumed acquiring MR data would be a function of N×T×TR. However, some of the N extra encodings may be unnecessary. Therefore, rather than blindly making extra encodings that consume N×T×TR, example apparatus may do a single scout scan, which may consume just one TR, and then determine a number M of additional encodings (M<N, M being an integer) that are relevant based on the amplitude of NMR signal produced in response to the different encodings. Imaging may then proceed using members of the M relevant extra encodings. Therefore, the time consumed to produce usable data that supports making meaningful corrections is a function of TR+T×M×TR, which is less than T×N×TR.

Recall that near metal, a slice may get distorted. The distortion may cause the slice to be shifted, to be broadened, to be compressed, or to be compromised in other ways or combinations of ways. The distortion may cause through plane de-phasing, which causes a lack of signal near the metal. Yet the area near the metal may be the very spot that a doctor wants to see.

The issues caused by the distortion may be exacerbated by the fact that distortions may vary between acquisitions, even for the same patient. The distortion may vary as a function of the size of the metal, the type of the metal, the orientation of the metal with respect to the main magnetic field B0, or with other factors. Therefore, example apparatus and methods excite the slice that is getting distorted to determine what effect the distortion is producing and how to account for that effect. The slice is phase encoded. While phase encoding in the slice direction may cause loss of one type of signal that may be useful in imaging, the excitation with phase encoding in the slice direction may yield a different type of signal near the implant. The different type of signal may be useful for determining relevant extra encodings for subsequent image acquisition. Determining relevant extra encodings may facilitate improving image quality over conventional approaches while reducing the amount of time required to acquire extra encodings that improve image quality.

Figure 6:
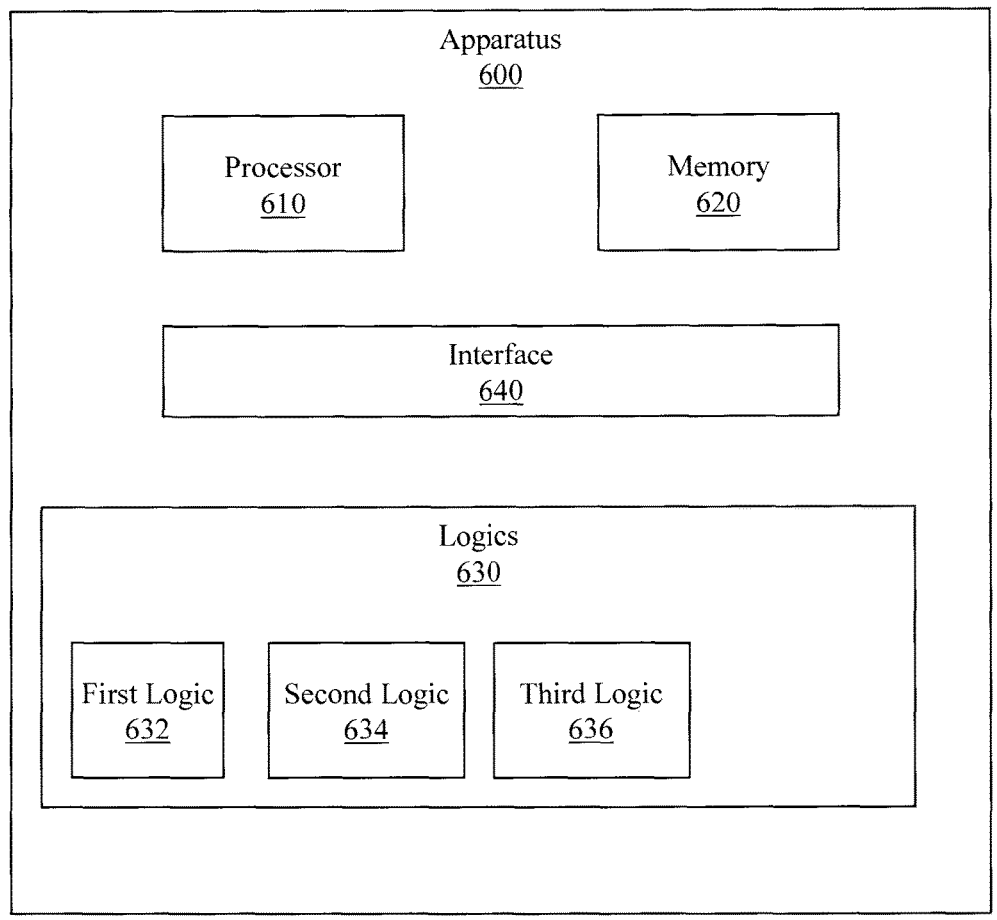
FIG. 6 illustrates an apparatus that mitigates artifacts associated with metal.

FIG. 6 illustrates an apparatus 600 for mitigating artifacts associated with metal in an MRI FOV by performing auto-detection and using adaptive encodings. Apparatus 600 includes a processor 610, a memory 620, a set 630 of logics, and an interface 640 to connect the processor 610, the memory 620, and the set 630 of logics. In one embodiment, apparatus 600 may be a special purpose computer that is created as a result of programming a general purpose computer. In another embodiment, apparatus 600 may include special purpose circuits that are added to a general purpose computer to produce a special purpose computer. In one embodiment, the set of logics 630 may mitigate artifacts associated with a susceptibility effect produced by metal in or on an object to be imaged using magnetic resonance imaging (MRI).

In one embodiment, the set 630 of logics includes a first logic 632 that establishes a center frequency for imaging a slice of the object. The center frequency may be the frequency that would normally be used for the type of MRI being performed. The first logic 632 also establishes one or more off-center frequencies for imaging a slice that is affected by the susceptibility effect. While conventional systems may use a pre-determined number of off-center frequencies, example apparatus and methods auto-detect an offset frequency spectrum that produces relevant results. The offset frequency spectrum may be smaller than the spectrum produced using the pre-determined number of encodings in conventional systems, which may in turn allow imaging to be performed more quickly.

In one embodiment, the first logic 632 establishes the one or more off-center frequencies by starting at the center frequency and moving away from that center frequency until the edge of the spectrum has been found. In one example, the first logic 632 repeatedly excites the slice using candidate frequencies that are offset progressively further from the center frequency until an amplitude of an NMR signal acquired in response to exciting the slice using the candidate frequency is less than a threshold. In one embodiment, the threshold may be a pre-determined amplitude while in another embodiment the threshold may be determined from amplitudes acquired at the other off-center frequencies that have been tried.

In one embodiment, the first logic 632 may establish the off-center frequencies by exciting the slice using a pre-determined set of off-center frequencies and picking frequencies that produce an NMR signal having an amplitude that exceeds a threshold at a pre-determined location in k-space. For example, twenty off-center frequencies may be employed and the amplitude of NMR signal produced from the slice in response to the twenty off-center frequencies may be analyzed. The slice or slices having the greatest amplitude at a pre-determined location in k-space may be used for subsequent imaging. In one embodiment, the pre-determined location in k-space may be the center of k-space.

The set of logics 630 may also include a second logic 634 that excites the slice using the center frequency and the one or more off-center frequencies. While first logic 632 may excite the slice to acquire information for identifying the offset frequency spectrum, second logic 634 may excite the slice to acquire NMR signal from which an image can be reconstructed. Thus, the first logic 632 and the second logic 634 may prepare and excite the slice differently. For example, the first logic 632 may not phase encode the slice while the second logic 634 may phase encode the slice. The off-center frequencies are selected to facilitate acquiring NMR signal suitable for correcting for an in-plane artifact or a through-plane artifact caused by the susceptibility effect. In one embodiment, as part of exciting the slice, the second logic 634 controls a phase encoding gradient, a slice select gradient, and a readout gradient.

The set of logics 630 may also include a third logic 636 that produces an image from NMR signal produced in response to exciting the slice using the center frequency and the one or more off-center frequencies. In one embodiment, the image may initially be created using NMR signal produced in response to exciting the slice using the center frequency and may then be corrected using NMR signal produced in response to exciting the slice with the off-center frequencies. In another embodiment, the image may be created using NMR signal produced in response to both the center frequency and the off-center frequencies.

Figure 7:
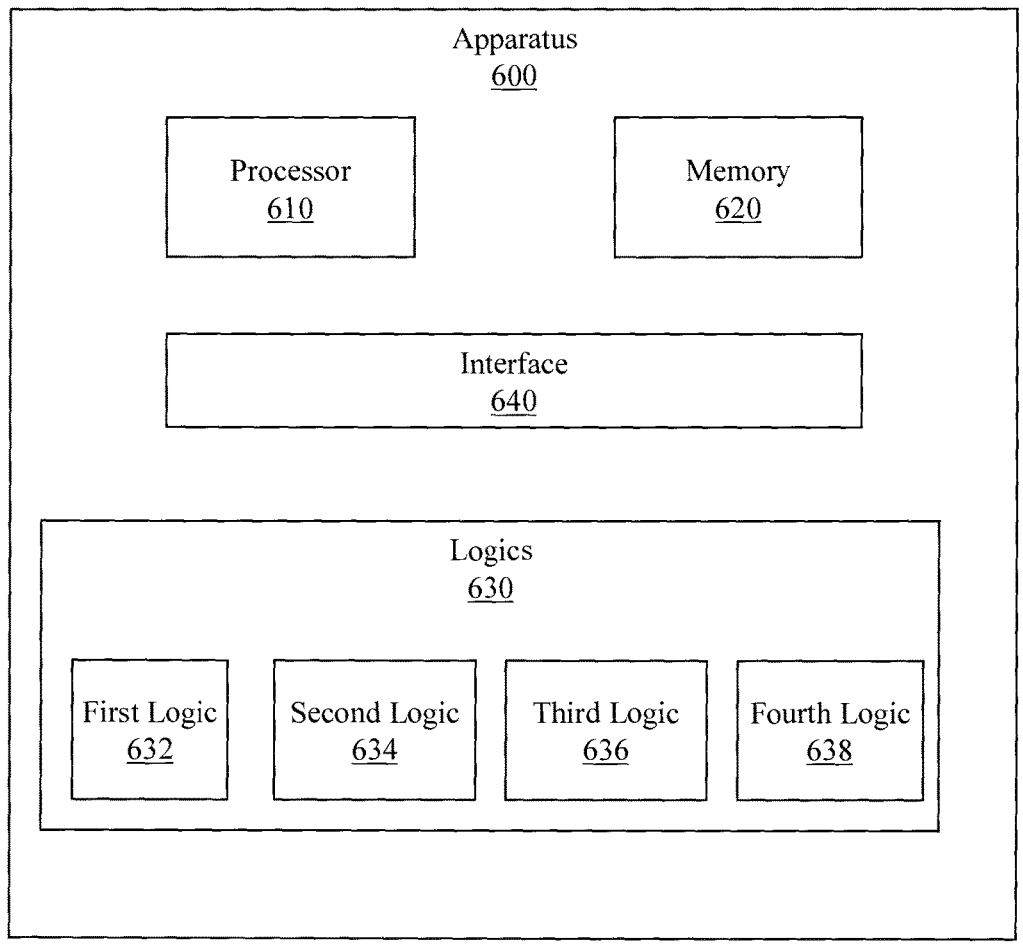
FIG. 7 illustrates an apparatus that mitigates artifacts associated with metal.

FIG. 7 illustrates another embodiment of apparatus 600. This embodiment of apparatus 600 includes a fourth logic 638 that controls the first logic 632 to establish a number of off-center frequencies as a function of the distortion in the NMR signal produced by the object in response to exciting the slice using the center frequency. For example, if there is a large detectable distortion produced in response to exciting the slice using the center frequency then the fourth logic 638 may control the first logic 632 to establish a larger number of off-center frequencies while if there is just a small detectable distortion then the fourth logic 638 may control the first logic 632 to establish a smaller number of off-center frequencies. In one embodiment, the fourth logic 638 may control the first logic 632 to selectively not establish the one or more off-center frequencies upon determining that the NMR signal produced by the object in response to excitation by the center frequency is distorted less than a threshold amount.

Figure 8:
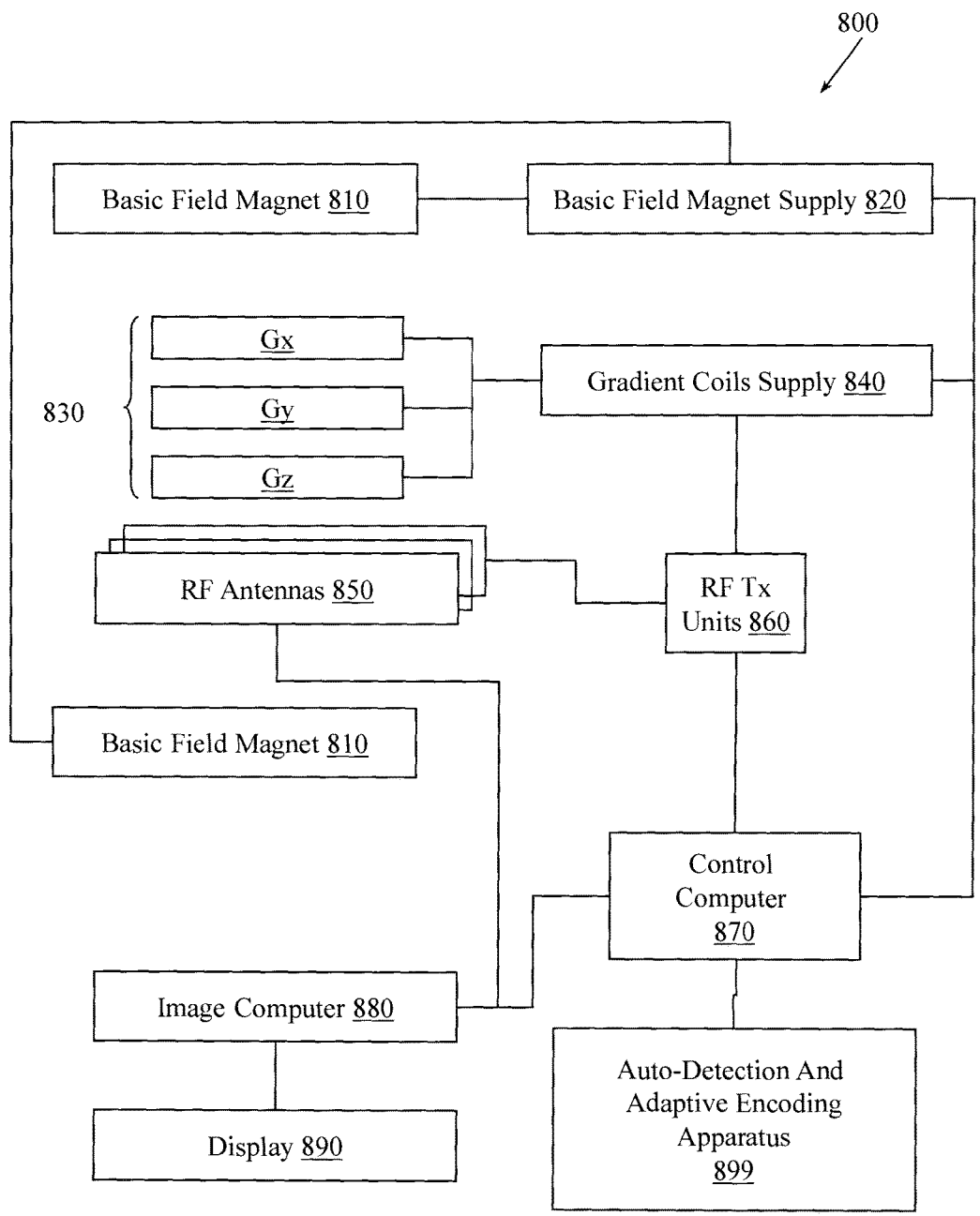
FIG. 8 illustrates an MRI apparatus that mitigates artifacts associated with metal.

FIG. 8 illustrates an MRI apparatus 800. MRI apparatus 800 is configured with an auto-detection and adaptive encoding apparatus 899. The auto-detection and adaptive encoding apparatus 899 may be configured with elements of example apparatus described herein or may perform example methods described herein. The auto-detection and adaptive encoding apparatus 899 may control apparatus 800 to identify a useful spectrum of frequencies offset from a standard or center frequency used to image a slice. Since the useful spectrum may be smaller than a pre-determined spectrum, imaging may proceed more quickly when aided by auto-detection and adaptive encoding apparatus 899.

The apparatus 800 includes a basic field magnet(s) 810 and a basic field magnet supply 820. Ideally, the basic field magnets 810 would produce a uniform $B_0$ field. However, in practice, the $B_0$ field may not be uniform, and may vary over an object being imaged by the MRI apparatus 800. MRI apparatus 800 may include gradient coils 830 configured to emit gradient magnetic fields like $G_S$, $G_P$ and $G_R$ or $G_X$, $G_Y$, and $G_Z$. The gradient coils 830 may be controlled, at least in part, by a gradient coils supply 840. In some examples, the timing, strength, and orientation of the gradient magnetic fields may be controlled, and thus selectively adapted, during an MRI procedure. Example apparatus and methods may control the gradient magnetic fields a first way during acquisition of scout data from which an offset frequency spectrum may be identified and may control the gradient magnetic fields a second, different way during acquisition of imaging data from which a corrected MRI may be reconstructed.

MRI apparatus 800 may include a set of RF antennas 850 that are configured to generate RF pulses and to receive resulting NMR signals from an object to which the RE pulses are directed. In one embodiment, the RF antennas 850 are arranged as an array of parallel transmission coils that are individually controllable. How the pulses are generated and how the resulting MR signals are received may be controlled and thus may be selectively adapted during an MR procedure. Separate RF transmission and reception coils can be employed. The RF antennas 850 may be controlled, at least in part, by a set of RF transmission units 860. An RF transmission unit 860 may provide a signal to an RF antenna 850. The RF transmission unit 860 may provide different signals to different RF antennas to produce different RF excitations from the different members of the array of parallel transmission coils. In one example, the different RF excitations may have different flip angles and different TRs.

The gradient coils supply 840 and the RF transmission units 860 may be controlled, at least in part, by a control computer 870. In one example, the control computer 870 may be programmed to control an NMR device as described herein. Conventionally, the magnetic resonance signals received from the RF antennas 850 can be employed to generate an image and thus may be subject to a transformation process like a two dimensional fast Fourier transform (FFT) that generates pixilated image data. The transformation can be performed by an image computer 880 or other similar processing device. The image data may then be shown on a display 890. While FIG. 8 illustrates an example MRI apparatus 800 that includes various components connected in various ways, it is to be appreciated that other MRI apparatus may include other components connected in other ways.

Figure 9:
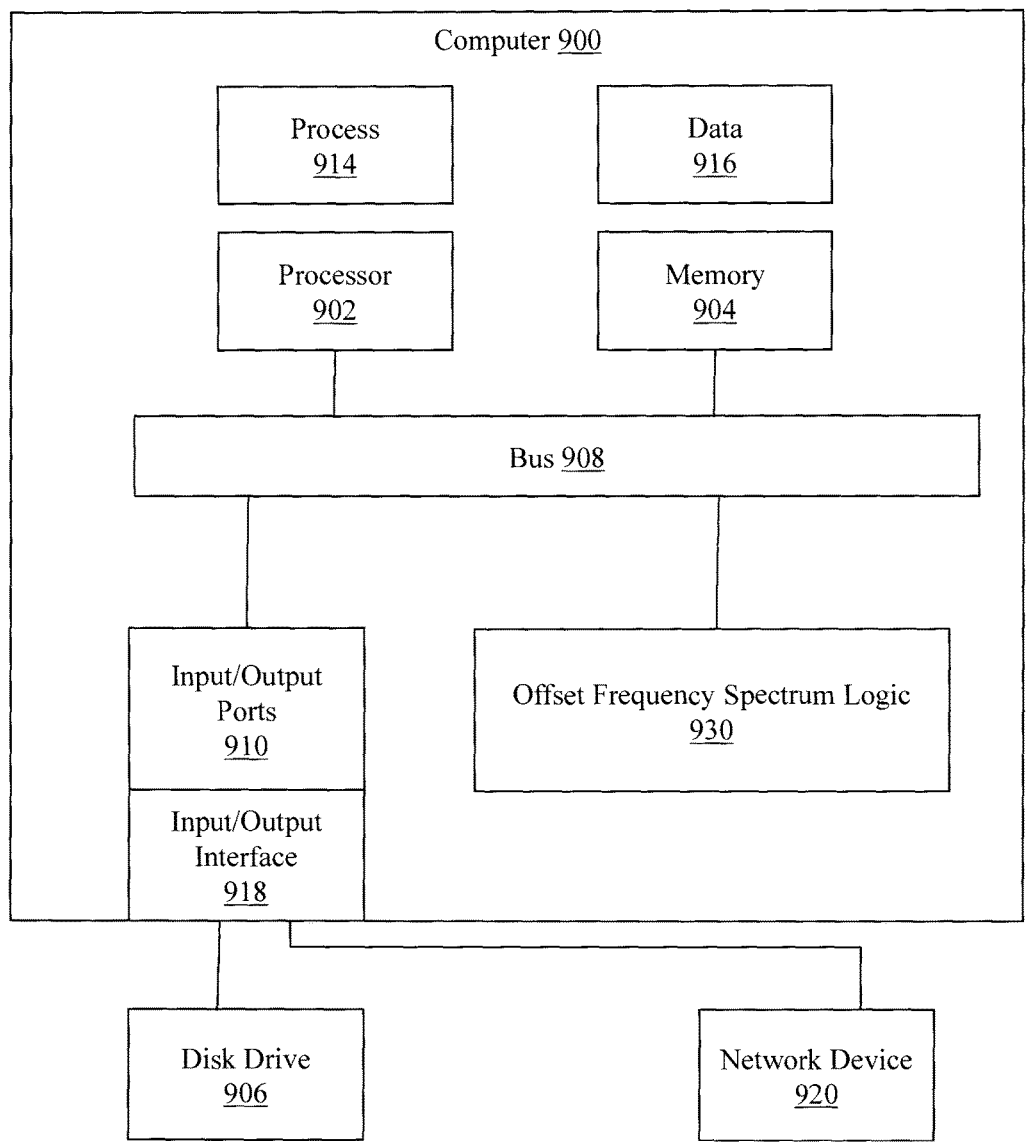
FIG. 9 illustrates a computer that mitigates artifacts associated with metal.

FIG. 9 illustrates an example computing device in which example systems and methods described herein, and equivalents, may operate. The example computing device may be a computer 900 that includes a processor 902, a memory 904, and input/output ports 910 operably connected by a bus 908. In one example, the computer 900 may include an offset frequency spectrum logic 930 that facilitates selecting a relevant set of additional frequency encodings to mitigate artifacts associated with the susceptibility effect produced by material in an MRI FOV. In different examples, the offset frequency spectrum logic 930 may be implemented in hardware, software, firmware, and/or combinations thereof. While the offset frequency spectrum logic 930 is illustrated as a hardware component attached to the bus 908, it is to be appreciated that in one example, the offset frequency spectrum logic 930 could be implemented in the processor 902.

In one embodiment, logic 930 may provide means (e.g., hardware, software, firmware, circuit) for controlling an MRI apparatus to excite a slice that is affected by a susceptibility effect. Logic 930 may excite the slice using a first pre-determined frequency and a plurality of scout frequency encodings. The scout frequency encodings may cover a wide frequency spectrum from which only the most relevant frequency encodings may be selected for subsequent imaging. Logic 930 may also provide means (e.g., hardware, software, firmware, circuit) for acquiring nuclear magnetic resonance (NMR) signal data from the slice in response to exciting the slice using the first pre-determined frequency and the plurality of scout frequency encodings. The NMR signal may have different amplitudes. The different amplitudes may be a function of the distortion produced by the susceptibility effect. An NMR signal having the highest amplitude may provide the most signal for correcting an image. An NMR signal having the lowest amplitude may identify where there is little or no distortion and thus may identify where little or no correction may be required.

Logic 930 may also provide means (e.g., hardware, software, firmware, circuit) for selecting members of the plurality of scout frequency encodings to use to image the slice. The scout frequency encodings may be selected as a function of an amplitude of the NMR signal data. In one embodiment, scout frequency encodings that produce the greatest amplitudes may be selected to acquire information from which corrections can be made. In one embodiment, scout frequency encodings that produce the smallest amplitudes may be selected so that, for example, subsequent acquisitions can be amplitude tested to determine whether an unexpected change in amplitude has been caused by an irregular distortion. Logic 930 may also provide means (e.g., hardware, software, firmware, circuit) for controlling the MRI apparatus to produce an image of the slice using the first pre-determined frequency or the members of the plurality of scout frequency encodings. Imaging the slice using the members of the plurality of scout frequency encodings provides data for correcting a reconstructed image of the slice. Logic 930 may also provide means (e.g., hardware, software, firmware, circuit) for correcting the image of the slice using the data for correcting the reconstructed image.

The means associated with logic 930 may be implemented, for example, as an application specific integrated circuit (ASIC). The means may also be implemented as computer executable instructions that are presented to computer 900 as data 916 that are temporarily stored in memory 904 and then executed by processor 902.

Generally describing an example configuration of the computer 900, the processor 902 may be a variety of various processors including dual microprocessor and other multi-processor architectures. A memory 904 may include volatile memory and/or non-volatile memory. Non-volatile memory may include, for example, read only memory (ROM), and programmable ROM (PROM). Volatile memory may include, for example, random access memory (RAM), static RAM (SRAM), and dynamic RAM (DRAM).

A disk 906 may be operably connected to the computer 900 via, for example, an input/output interface (e.g., card, device) 918 and an input/output port 910. The disk 906 may be, for example, a magnetic disk drive, a solid state disk drive, a floppy disk drive, a tape drive, a solid state drive (SSD), a flash memory card, or a memory stick. Furthermore, the disk 906 may be a CD-ROM drive, a CD-R drive, a CD-RW drive, a DVD ROM drive, a Blu-Ray drive, or an HD-DVD drive. The memory 904 can store a process 914 and/or a data 916, for example. The disk 906 and/or the memory 904 can store an operating system that controls and allocates resources of the computer 900.

The bus 908 may be a single internal bus interconnect architecture and/or other bus or mesh architectures. While a single bus is illustrated, it is to be appreciated that the computer 900 may communicate with various devices, logics, and peripherals using other busses (e.g., PCIE, 1394, USB, Ethernet). The bus 908 can be types including, for example, a memory bus, a memory controller, a peripheral bus, an external bus, a crossbar switch, and/or a local bus.

The computer 900 may interact with input/output (i/o) devices via the i/o interfaces 918 and the i/o ports 910. I/O devices may be, for example, a keyboard, a microphone, a pointing and selection device, cameras, video cards, displays, the disk 906, or the network devices 920. The input/output ports 910 may include, for example, serial ports, parallel ports, and USB ports.

The computer 900 can operate in a network environment and thus may be connected to the network devices 920 via the i/o interfaces 918, and/or the i/o ports 910. Through the network devices 920, the computer 900 may interact with a network. Through the network, the computer 900 may be logically connected to remote computers. Networks with which the computer 900 may interact include, but are not limited to, a LAN, a WAN, and other networks.

Some portions of the detailed descriptions that follow are presented in terms of algorithms and symbolic representations of operations on data bits within a memory. These algorithmic descriptions and representations are used by those skilled in the art to convey the substance of their work to others. An algorithm is considered to be a sequence of operations that produce a result. The operations may include creating and manipulating physical quantities that may take the form of electronic values. Creating or manipulating a physical quantity in the form of an electronic value produces a concrete, tangible, useful, real-world result.

It has proven convenient at times, principally for reasons of common usage, to refer to these signals as bits, values, elements, symbols, characters, terms, numbers, and other terms. It should be borne in mind, however, that these and similar terms are to be associated with the appropriate physical quantities and are merely convenient labels applied to these quantities. Unless specifically stated otherwise, it is appreciated that throughout the description, terms including processing, computing, and determining, refer to actions and processes of a computer system, logic, processor, or similar electronic device that manipulates and transforms data represented as physical quantities (e.g., electronic values).

Example methods may be better appreciated with reference to flow diagrams. For simplicity, the illustrated methodologies are shown and described as a series of blocks. However, the methodologies may not be limited by the order of the blocks because, in some embodiments, the blocks may occur in different orders than shown and described. Moreover, fewer than all the illustrated blocks may be required to implement an example methodology. Blocks may be combined or separated into multiple components. Furthermore, additional or alternative methodologies can employ additional, not illustrated blocks.

Figure 10:
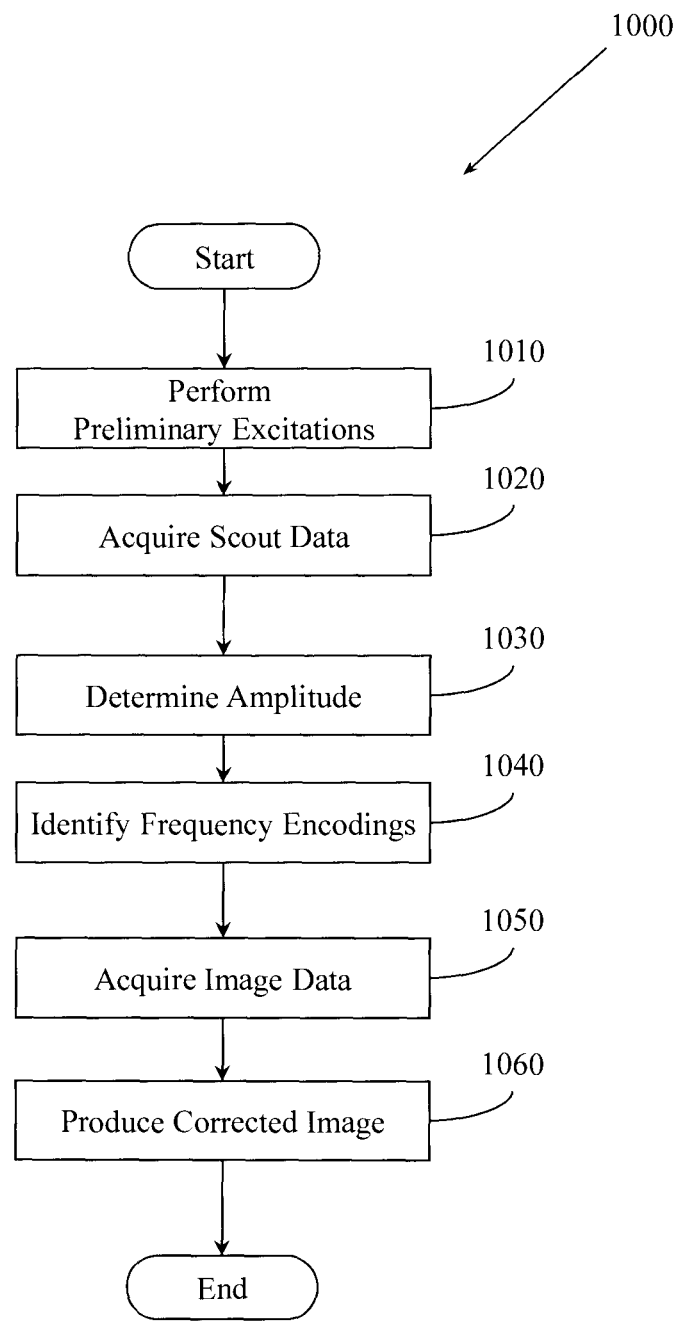
FIG. 10 illustrates a method that mitigates artifacts associated with metal.

FIG. 10 illustrates an example method 1000 that mitigates artifacts associated with metal in an MRI FOV by auto-detection and adaptive encoding. Method 1000 may include, at 1010, controlling an MRI apparatus to perform N different preliminary excitations of a slice of an object, N being an integer greater than one. The N different preliminary excitations have different frequency encodings that are offset by frequency from a first (e.g., center) frequency encoding. The N different preliminary excitations may have frequencies on either side of the first (e.g., center) frequency. In one embodiment, the N different preliminary excitations may be equally spaced apart while in another embodiment, the N different preliminary excitations may have variable spacing. In one embodiment, the preliminary excitations do not phase encode the slice but do control a slice select gradient and a readout gradient.

Method 1000 may also include, at 1020, controlling the MRI apparatus to acquire a scout data set. A member of the scout data set is acquired from NMR signal produced by the slice in response to a preliminary excitation(s). In one embodiment, the scout data set may be acquired in a single repetition time (TR). The metal affecting the object may be, for example, a portion of a hip implant, a knee implant, a shoulder implant, an orthopedic device, or a dental implant. The metal may not actually be in the object, but may be on or near the object. For example, a stereotactic frame or external orthopedic frame that is holding anatomy in place may be in the field of view and may be producing an effect. The metal may also be, for example, wires or other portions of an apparatus (e.g., life support apparatus) currently being used by the patient. The metal may be, for example, stainless steel or titanium or other metals.

A member of the scout data set will have an amplitude that is a function, at least in part, of a distortion caused by the metal. Thus, method 1000 may also include, at 1030, determining an amplitude of the NMR signal at a pre-determined location in k-space for the member of the scout data set. The pre-determined location may be, for example, the center of k-space. The amplitudes may be used to select frequency encodings that are to be used in subsequent imaging.

Method 1000 may also include, at 1040, identifying M different frequency encodings associated with the N different preliminary excitations, M being an integer less than N. The M different frequency encodings are selected based, at least in part, on the amplitudes of members of the scout data set. The M different frequency encodings are to be used for subsequent imaging of the object. For example, frequency encodings that produce the largest amplitudes may be selected while frequency encodings that produce the smallest amplitudes may not be selected. Different amplitudes may be selected in different applications.

In one embodiment, identifying the M different frequency encodings may include identifying a member of the scout data set having the greatest amplitude. In one embodiment, the M different frequency encodings may include identifying a member of the scout data set having an amplitude that exceeds an amplitude threshold. The threshold may be a pre-determined threshold or may be established based, for example, on the average amplitude produced in the scout data set. In one embodiment, the members of the scout data set may be ranked based on amplitude. In this embodiment, identifying the M different frequency encodings may include selecting members of the scout data set based on the ranking. In one embodiment, N may be set greater than 16, M may be set less than 8, and identifying the M different frequency encodings may be performed in less than one minute. In different embodiments, other values for M and N may be employed and other periods of time may be employed. Unlike conventional systems that use all N frequencies, example apparatus and methods select less than all N frequencies to reduce imaging time.

The M different frequency encodings may be selected to facilitate correcting for or avoiding distortions caused by the metal affecting the object. The distortion may be, for example, a through-plane distortion associated with slice selection frequency encoding. The distortion may also be, for example, in-plane distortion associated with presence of frequency encoding in the readout direction.

Method 1000 may also include, at 1050, controlling the MRI apparatus to acquire image data using one or more of the M different frequency encodings. Recall that the M different frequency encodings facilitate correcting for or avoiding a distortion caused by a susceptibility effect produced in the object by metal. The preliminary excitations at 1010 may be performed using a first excitation scheme while the image data may be acquired at 1050 using a second, different excitation scheme. For example, controlling the MRI apparatus to acquire the image data at 1050 may include phase encoding the slice and repeatedly imaging the slice using different members of the M different frequency encodings. Controlling the MRI apparatus to perform the preliminary excitations may have included not phase encoding the slice but frequency encoding the slice. In one embodiment, imaging may continue until a viewer (e.g., radiologist, automated process) of the image terminates imaging. In another embodiment, imaging may continue until a threshold period of time has expired.

Method 1000 may also include, at 1060, producing a corrected image using the image data associated with one or more of the M different frequency encodings. In one embodiment, the corrected image may be made by producing a first image from a first frequency encoding (e.g., center frequency) and then correcting the image using data from off-center frequencies. In another embodiment, an image may initially be constructed from data from the on and off-center frequencies. In yet another embodiment, an image may initially be constructed from selected members of the off-center frequencies.

While FIG. 10 illustrate various actions occurring in serial, it is to be appreciated that various actions illustrated in FIG. 10 could occur substantially in parallel. By way of illustration, a first process could acquire scout data, a second process could determine the offset frequency spectrum, and a third process could acquire image data and produce a corrected image. While three processes are described, it is to be appreciated that a greater and/or lesser number of processes could be employed and that lightweight processes, regular processes, threads, and other approaches could be employed.

In one example, a method may be implemented as computer executable instructions. Thus, in one example, a computer-readable storage medium may store computer executable instructions that if executed by a machine (e.g., processor) cause the machine to perform a method (e.g., method 1000). While executable instructions associated with the above method are described as being stored on a computer-readable storage medium, it is to be appreciated that executable instructions associated with other example methods described herein may also be stored on a computer-readable storage medium.

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the embodiments described herein. Therefore, the invention is not limited to the specific details, the representative apparatus, and illustrative examples shown and described. Thus, this application is intended to embrace alterations, modifications, and variations that fall within the scope of the appended claims.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and other similar exemplary language indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer component", as used herein, refers to a computer-related entity (e.g., hardware, firmware, software in execution, combinations thereof). Computer components may include, for example, a process running on a processor, a processor, an object, an executable, a thread of execution, and a computer. A computer component(s) may reside within a process and/or thread. A computer component may be localized on one computer and/or may be distributed between multiple computers.

"Computer communication", as used herein, refers to a communication between computing devices (e.g., computer, personal digital assistant, cellular telephone) and can be, for example, a network transfer, a file transfer, an applet transfer, an email, an HTTP transfer, and other transfer. A computer communication can occur across, for example, a wireless system (e.g., IEEE 802.11), an Ethernet system (e.g., IEEE 802.3), a token ring system (e.g., IEEE 802.5), a LAN, a WAN, a point-to-point system, a circuit switching system, a packet switching system, and other system.

"Computer-readable storage medium", as used herein, refers to a medium that stores instructions or data. "Computer-readable storage medium" does not refer to propagated signals, per se. A computer-readable storage medium may take forms, including, but not limited to, non-volatile media, and volatile media. Non-volatile media may include, for example, optical disks, magnetic disks, tapes, flash memory, ROM, and other media. Volatile media may include, for example, semiconductor memories, dynamic memory (e.g., dynamic random access memory (DRAM), synchronous dynamic random access memory (SDRAM), double data rate synchronous dynamic random-access memory (DDR SDRAM), etc.), and other media. Common forms of a computer-readable storage medium may include, but are not limited to, a floppy disk, a flexible disk, a hard disk, a magnetic tape, other magnetic medium, a compact disk (CD), other optical medium, a random access memory (RAM), a read only memory (ROM), a memory chip or card, a memory stick, and other media from which a computer, a processor or other electronic device can read.

"Data store", as used herein, refers to a physical and/or logical entity that can store data. A data store may be, for example, a database, a table, a file, a data structure (e.g. a list, a queue, a heap, a tree) a memory, a register, and other stores. In different examples, a data store may reside in one logical and/or physical entity and/or may be distributed between two or more logical and/or physical entities.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and other entities. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, and other items, that can be received, transmitted and/or detected.

"Software", as used herein, includes but is not limited to, one or more executable instructions that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, and/or programs including separate applications or code from dynamically linked libraries.

"User", as used herein, includes but is not limited to one or more persons, software, logics, computers or other devices, or combinations of these.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, ABC, AAA, AAB, AABB, AABBC, AABBCC, (e.g., the data store may store only A, only B, only C, A&B, A&C, B&C, A&B&C, A&A&A, A&A&B, A&A&B&B, A&A&B&B&C, A&A&B&B&C&C). It is not intended to require one of A, one of B, and one of C. When the applicants intend to indicate "at least one of A, at least one of B, and at least one of C", then the phrasing "at least one of A, at least one of B, and at least one of C" will be employed.

Throughout this specification and the claims that follow, unless the context requires otherwise, the words 'comprise' and 'include' and variations such as 'comprising' and 'including' will be understood to be terms of inclusion and not exclusion. For example, when such terms are used to refer to a stated integer or group of integers, such terms do not imply the exclusion of any other integer or group of integers.

What is claimed is:

1. A method, comprising:
controlling a magnetic resonance imaging (MRI) apparatus to perform N different preliminary excitations of a slice of an object, where the N different preliminary excitations have different frequency encodings, where the different frequency encodings are offset by frequency from a first frequency encoding, N being an integer greater than one;
controlling the MRI apparatus to acquire a scout data set, where a member of the scout data set is acquired from nuclear magnetic resonance (NMR) signal produced by the slice in response to one or more of the N different preliminary excitations;
determining an amplitude of the NMR signal at a pre-determined location in k-space for a member of the scout data set;
identifying M different frequency encodings associated with the N different preliminary excitations based, at least in part, on the amplitudes of members of the scout data set, M being an integer less than N, where the M different frequency encodings are to be used for subsequent imaging of the object;
controlling the MRI apparatus to acquire an image data using one or more of the M different frequency encodings, where the M different frequency encodings facilitate correcting for a distortion caused by a susceptibility effect produced by metal affecting the object; and
producing a corrected image using the image data associated with one or more of the M different frequency encodings.

2. The method of claim 1, where performing a preliminary excitation of the slice includes not phase encoding the slice in the slice direction, frequency encoding the slice, controlling a slice select gradient for the slice, and controlling a readout gradient for the slice.

3. The method of claim 1, where controlling the MRI apparatus to acquire the image data includes phase encoding the slice and repeatedly imaging the slice using different members of the M different frequency encodings until a viewer of the image terminates imaging.

4. The method of claim 1, where controlling the MRI apparatus to acquire the image data includes phase encoding the slice and repeatedly imaging the slice using different members of the M different frequency encodings until a threshold period of time has expired.

5. The method of claim 1, where identifying the M different frequency encodings includes identifying a member of the scout data set having the greatest amplitude or identifying a member of the scout data set having an amplitude that exceeds an amplitude threshold.

6. The method of claim 1, comprising producing a ranking of the members of the scout data set, where the ranking is based on amplitude, and where identifying the M different frequency encodings includes selecting members of the scout data set based on the ranking.

7. The method of claim 1, where the pre-determined location in k-space is the center of k-space.

8. The method of claim 1, where N is greater than 16, where M is less than 8, and where identifying the M different frequency encodings is performed in less than one minute.

9. The method of claim 1, where the scout data set is acquired in a single repetition time (TR).

10. The method of claim 1, where the metal is a portion of a hip implant, a knee implant, a shoulder implant, an orthopedic device, or a dental implant.

11. The method of claim 1, where the metal is stainless steel or titanium.

12. The method of claim 1, where the M different frequency encodings facilitate correcting for a through-plane distortion caused by the metal, where the through-plane distortion is associated with slice selection frequency encoding.

13. The method of claim 1, where the M different frequency encodings facilitate correcting for an in-plane artifact caused by the metal, where the in-plane distortion is associated with presence of frequency encoding in the readout direction.

14. A magnetic resonance imaging (MRI) apparatus, comprising:
means for controlling the MRI apparatus to excite a slice using a first pre-determined frequency and a plurality of scout frequency encodings, where the slice is affected by a susceptibility effect;
means for acquiring nuclear magnetic resonance (NMR) signal data from the slice in response to exciting the slice using the first pre-determined frequency and the plurality of scout frequency encodings;
means for selecting members of the plurality of scout frequency encodings to use to image the slice, where the scout frequency encodings are selected as a function of an amplitude of the NMR signal data;

means for controlling the MRI apparatus to produce an image of the slice using the first pre-determined frequency or the members of the plurality of scout frequency encodings, where imaging the slice using the members of the plurality of scout frequency encodings provides data for correcting a reconstructed image of the slice, and means for correcting the image of the slice using the data for correcting the reconstructed image.

* * * * *